METHOD OF DIFFUSION

Original Filed Nov. 22, 1960

2 Sheets-Sheet 1

James O. McCaldin,
INVENTOR.
BY.
W Hlue Allister Jr.
ATTORNEY.

Sept. 7, 1965 J. O. McCALDIN 3,205,102

METHOD OF DIFFUSION

Original Filed Nov. 22, 1960 2 Sheets-Sheet 2

James O. McCaldin,
*INVENTOR.*

*BY.*

W Hlua Allister Jr.

*ATTORNEY.*

United States Patent Office 3,205,102

Patented Sept. 7, 1965

3,205,102

METHOD OF DIFFUSION

James O. McCaldin, Los Angeles, Calif., assignor to Hughes Aircraft Company, Culver City, Calif., a corporation of Delaware Continuation of application Ser. No. 70,951, Nov. 22, 1960. This application Sept. 16, 1963, Ser. No. 309,917

6 Claims. (Cl. 148—189)

This is a continuation of my application S.N. 70,951, filed November 22, 1960, entitled "Method of Diffusion," now abandoned.

This invention relates to diffusion techniques for use in the manufacture of semiconductor devices, such as diodes and transistors. More particularly, the invention relates to the gaseous diffusion of conductivity-type-determining materials into semiconductive bodies for the purpose of establishing in such bodies areas therein of a desired type of conductivity to a predetermined extent.

It is well known that semiconductor rectifying and/or amplifying devices are provided by the establishment of one or more rectifying junctions or barriers in semiconductor bodies. Such junctions are formed between adjacent regions of different or opposite types of conductivity in a semiconductor body. These junctions are usually nominated "P–N junctions" in the semiconductor art although rectifying junctions may be established between regions of different rather than opposite conductivity. Thus, for example, $P-P^+$ junctions or $N-N^-$ junctions may be formed. The term N-type conductivity is intended herein to refer to the conduction of current in a semiconductor body by means of electrons available in such body due to the presence of a material therein capable of giving up electrons, such a material therefore being called a "donor impurity." The term P-type conductivity is intended herein to refer to the conduction of current in a semiconductor body by means of "holes" present in such body due to the presence of a material therein capable of borrowing or accepting electrons, such a material therefore being called an "acceptor impurity." Such junctions as $P-P^+$ junctions may be established by adjacent regions having the same or like conductivity-type-determining impurities disposed therein but of different concentrations and hence resistivities.

The introduction of such conductivity-type-determining impurities into a semiconductor body may be accomplished by several methods but the present invention relates to a process of increasing value and interest because of the excellent opportunity for controlling the amount and distribution of the impurity afforded thereby. This is the process of diffusing atoms of a conductivity-type-determining material (called the "diffusant" in this process) into a substrate or semiconductor body without significant melting of the substrate. By way of contrast, fusion and alloying describe the introduction of an impurity agent into a substrate by melting at least a portion of the substrate for the mixing of the impurity agent and substrate.

The invention has special application to processes which involve gaseous diffusion into silicon where a solid silicon body is exposed to a vapor which includes a conductivity-type-determining impurity in one of its oxidation states, including the elemental form, for the introduction of the conductivity-type-determining impurity as the diffusant into the silicon body without significant melting of the silicon body. It will be convenient hereinafter to describe as a conductivity-type-determining impurity, any element or compound which includes a component which will serve either as an acceptor or as a donor in a semiconductive body.

Heretofore two different systems have been in practice to accomplish the diffusion of a conductivity-type-determining impurity into a semiconductive body. In one system, hereinafter called the "closed tube" system, the semiconductive body is enclosed within a vessel with the conductivity-type-determining impurity and the vessel is sealed off from the atmosphere. Thereafter the vessel is heated to an appropriate temperature to achieve diffusion of the impurity into the semiconductive body. Such a system is disclosed in U.S. Patent No. 2,849,343 to F. A. Kroger et al.

The other diffusion system referred to hereinabove is disclosed in U.S. Patent No. 2,873,222 to L. Derick et al. This system may be called the "gas flow" or "open" system since the semiconductive body is disposed into an essentially open-ended tube and gas containing a conductivity-type-determining impurity is caused to flow through the tube and over the semiconductive body. As shown in the referenced patent to Derick et al. the source of vapor containing the conductivity-type-determining impurity may be external to the tube and pumped thereto and therethrough, possibly with an inert carrier gas, such as argon. Alternately the source may be positioned within the tube "upstream" of the semiconductive body, and heated to produce the conductivity-type-determining vapor which is carried "downstream" to the semiconductive body by a carrier gas.

One of the advantages of the closed tube system is that once purity of the interior of the container or tube and its contents has been achieved it is maintained throughout the diffusion process. In addition, the closed tube system is one which during the diffusion process is independent of kinetic changes, which is to say that the chemical processes involved in forming the diffusant vapor and in diffusing the impurity into the semiconductive body constitute a system isolated from their surroundings and may be carried out relatively undisturbed which results in a large measure of control over the diffusion process.

On the other hand there are serious drawbacks in the closed tube system which a manufacturer of diffused semiconductor devices must take into consideration. For one thing the cleansing and purification of the closed tube or capsule is difficult and tedious to accomplish. In addition a tube or capsule may be used only once since it is destroyed when opened at the end of the diffusion run. Also the tube or capsule must be of fusible or sealable material which limits the choice of materials which may be used for the capsule.

The open tube or gas flow system permits re-use of the apparatus involved any number of times and the choice of materials available for the apparatus is wider than in the case of the closed tube system since the limitation of employing sealable materials is not present. However, as practiced heretofore, the gas flow system has several disadvantages principally due to the necessity of employing a flowing stream of gas. Because there are large temperature differences within the tube, large convective gas flows are present; many diffusants are therefore nonuniformly distributed in the doping atmosphere which means uneven diffusion or doping of the semiconductive body. In addition, erosion of the surface of the semiconductive body often occurs especially when large gas velocities are employed. As described in Patent No. 2,802,760 to Derick et al. it was, in part at least, erosion or pitting during diffusion which led to the suggested use of an oxide film over the surface of the semiconductive body during diffusion. It will also be appreciated that the use of a relatively large amount of flowing gas will render temperature control within the system more difficult to achieve.

It has also been discovered that one of the reasons why uniform concentrations of the diffusant in the doping atmosphere cannot be established initially and maintained is because the diffusant is depleted from the diffusing atmosphere by reaction with the apparatus or containers therefor. It has been noticed that during the initial periods of diffusion, the semiconductive body may be doped unevenly by the diffusant but that subsequently the doping became relatively uniform as the absorbing or reacting diffusion apparatus became saturated and no longer depleted the diffusant from the doping atmosphere.

An object of the invention is to provide an improved method for diffusion whereby the advantages of both closed and open diffusion systems may be realized without the disadvantages of either. To this end, a semi-closed diffusion vessel having a pair of small opposed openings therein is disposed within a larger container or tube which is adapted to permit a stream of gas to flow therethrough as in the previously described open or gas flow system. The semiconductive body to be doped by the diffusant is disposed in the semi-closed vessel (which may be referred to as the diffusion vessel or chamber) together with a diffusant source. Both the diffusion vessel and the larger container therefor (hereinafter called the furnace tube) are adapted to be heated. The diffusant source within the diffusion vessel may be provided therein separately from the diffusion chamber or the diffusion chamber itself may constitute the diffusant source as will be described more fully hereinafter. During diffusion the diffusion vessel is heated and a stream of gas, which may be inert, is caused to flow through the furnace tube and around the diffusion vessel which is thus effectively sealed-off from the open atmosphere as in the aforedescribed closed tube system. By controlling the velocity of the gas stream in the furnace tube the gas stream can be made to flow through or substantially only around the diffusion chamber.

The invention will be described in greater detail by reference to the drawings wherein.

According to the present invention the semi-conductive body into which it is desired to diffuse a conductivity-type-determining impurity is disposed in an atmosphere containing the impurity which atmosphere is maintained out of contact with the ambient room atmosphere by means of a second atmosphere of controlled content and purity which envelops or surrounds the impurity-containing atmosphere. Communication between the impurity-containing or diffusing atmosphere and the enveloping or isolating atmosphere is maintained. The vessel which contains the semiconductive body is not integrally closed or sealed-off against the ambient atmosphere and is in fact adapted to be readily opened to permit the loading and unloading thereof. In addition, the vessel may be provided with one or more openings so as to permit the introduction thereinto of any desired atmosphere at any time prior to, during, or after actual diffusion of an impurity into the semiconductive body or other treatment thereof. Since this vessel is not sealed-off against the ambient atmosphere and is in fact provided with openings to permit communication with the interior of the vessel, the effect of a sealed-off vessel is achieved according to the present invention by surrounding this vessel and its semi-enclosed atmosphere and contents with an isolating atmosphere. This isolating atmosphere may be conveniently provided in apparatus, which will be described in greater detail hereinafter, wherein the isolating atmosphere is caused to flow gently through an additional vessel or furnace tube which contains the aforementioned semi-closed vessel. At any time by changing the velocity of the isolating atmosphere entry thereof into the semi-closed vessel can be provided.

Figure 1:
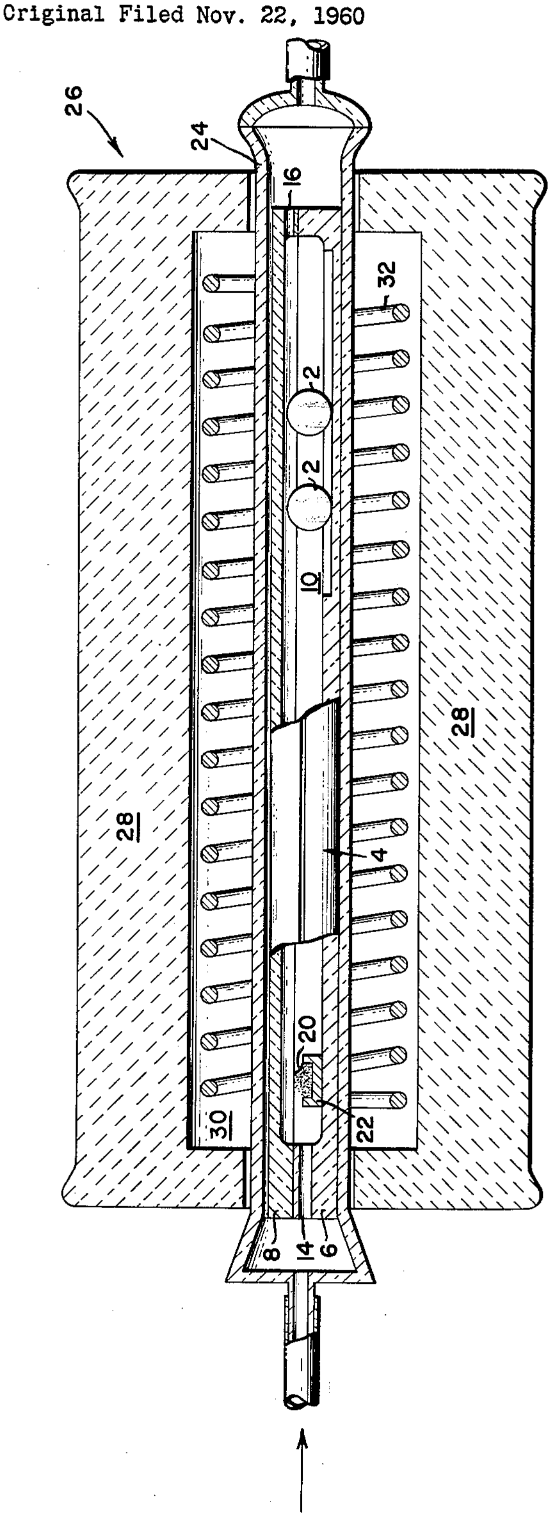
FIGURE 1 is an elevational view in section of diffusion apparatus suitable for the practice of the method of the present invention.
Figures 2, 3, 4, 5, 6:
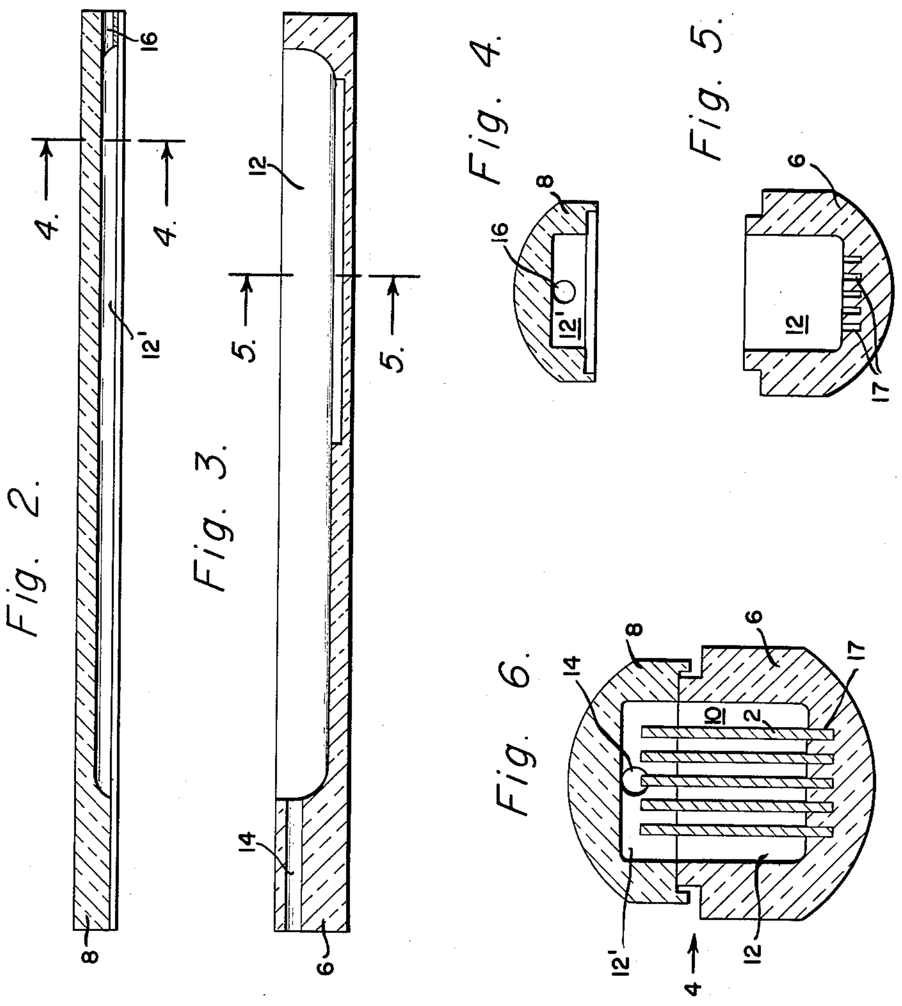
FIGURE 2 is an elevational view in section of the upper portion of a semi-closed vessel suitable for use in diffusion apparatus according to the method of the present invention.
FIGURE 3 is an elevational view in section of the lower portion of a semi-closed vessel suitable for use in diffusion apparatus according to the method of the present invention.
FIGURE 4 is a cross-sectional view of the upper portion of the semi-closed vessel shown in FIGURE 2 taken along the line 4—4 thereof.
FIGURE 5 is a cross-sectional view of the lower portion of the semi-closed vessel shown in FIGURE 3 taken taken along the line 5—5 thereof.
FIGURE 6 is a cross-sectional view of a semi-closed vessel with the upper and lower portions thereof in place for use in diffusion apparatus according to the method of the present invention.

According to the invention, and as an example of the method thereof, a semiconductive body of silicon, for example, may be doped by diffusion as follows. As shown in FIGURE 1, a silicon body 2, which may be a circular wafer about 15 mils thick and having a diameter of 0.75 inch, after having been suitably cleansed and prepared for diffusion by techniques known in the art, is disposed in a diffusion vessel 4 of quartz, for example. This vessel is shown in greater detail in FIGURES 2 to 6 inclusive. The diffusion vessel may be made of other refractories such as graphite or alumina, for example. As shown the diffusion vessel 4 comprises an elongated boat portion 6 having an upper lid portion 8, the two portions being adapted to be brought together to form a semi-closed chamber 10 defined by the cavity portions 12, 12', provided therein, respectively. One end of the boat 6 is provided with a passage or port 14 therethrough. The end of the lid 8 opposite to the end thereof which is disposed over the port-containing end of the boat 6, when the lid is in place on the boat, is likewise provided with a passage or port 16. Thus when the lid 8 is placed over the boat 6, a chamber 10 is formed by the cavities 12, 12' thereof and each end of the vessel is provided with an opening or port. In addition, the boat 6 is provided with one or more slots 17 in the bottom of the cavity portion 12 running along a portion of the length thereof to receive one or more semiconductive bodies to be processed.

A source of diffusant impurity 20 in a small crucible 22 may be placed within the vessel 4 with the semiconductive body or bodies 2. The lid 8 is then positioned in place over the boat 6 and the assembly is inserted within a tubular container 24 which itself is contained within a furnace 26, the ends of the container 24 protruding from the furnace 26. For convenience the container 24 is referred to as the furnace tube. The furnace tube 24, which may be of quartz, has one exterior end connected to a source of inert gas (not shown) which may be argon, for example. The other exterior end of the furnace tube 24 may be vented to the atmosphere or provided with a connection so as to convey any discharged gas to a collection chamber, likewise not shown. The furnace 26 comprises a relatively thick-walled container 28 of heat insulating material having an internal cavity 30 in which is disposed a heating element 32.

The furnace tube 24 and the diffusion vessel 4 are disposed in the furnace 26 so that the diffusant source 20 and the semiconductive body 2 are all positioned within the heating region of the furnace.

Prior to actually diffusing the impurity into the semiconductive body 2, the entire diffusion apparatus comprising the furnace tube 24 and the diffusion vessel 4 are purged of any undesirable atmosphere by causing an inert gas such as argon to flow therethrough at a velocity of about 20 cm. per second or more. The inert gas at this velocity will flow not only around the semi-closed diffusion vessel 4 but will also enter this vessel by means of the port 14 and exit therefrom by means of the port 16 so as to carry with it any undesired gases. These gases are then expelled from the end of the furnace tube 24. This purging operation may be continued for about 10 minutes in order to satisfactorily remove all of the undesired gases. Thereafter the flow of the inert gas into the tube 24 is reduced to a velocity of about 0.5 cm. per second or less. At this reduced or zero flow rate only a small amount or none of the inert gas will enter the semi-closed diffusion vessel 4. The diffusion vessel 4 however is effectively isolated from the ambient atmosphere since the vessel 4 and its openings are surrounded by the inert gas. Communication, however, between the interior of the diffusion vessel 4 and the atmosphere therein with the surrounding inert atmosphere is still available by means of the ports 14 and 16. Thus to all intents and purposes, the diffusion vessel 4 is an open vessel when it is desired to load or unload the same or when it is desired to flush the same with a purging inert gas. On the other hand, the diffusion vessel 4 is a closed vessel during the diffusion operation.

Actual diffusion is accomplished by energizing the heating element 32 so as to heat the silicon body 2 to a temperature of about 1100° C. At the same time the source 20 of diffusant impurity is heated to about the same temperature so that the impurity is rendered vaporous and dispersed throughout the diffusing chamber 10 into contact with the silicon body 2. It will be appreciated that the desired depth of diffusion is determined by the temperature and by the duration of the diffusion treatment. Thus a P-type region in silicon may be satisfactorily established to a depth of about 2 microns by diffusing boron into a silicon body for about 1 hour at a temperature of about 1150° C.

After a suitable diffusion depth has been obtained, the heating element 32 is de-energized and the flow of inert gas into the furnace tube 24 may be increased to a velocity of about 20 cm. per second so that the inert gas enters the diffusion vessel 4 and sweeps all of the diffusing atmosphere therefrom. When the apparatus has sufficiently cooled, the diffusion vessel 4 may be withdrawn from the furnace tube 24 and opened up to permit removal of the diffused semiconductive body 2. It will be appreciated that the semiconductive body 2 initially may have been intrinsic, that is not doped, in which case diffusion of either a donor or acceptor impurity will have resulted in forming an N-type or a P-type region therein with a rectifying junction between the N- or P-type region and the intrinsic bulk region where no diffusion occurred. On the other hand, a previously doped semiconductive body may have been employed and an impurity imparting the opposite type of conductivity may have been diffused so as to produce a body having adjacent P- and N-type regions with a P–N rectifying junction therebetween.

As a typical example, the semiconductive body 2 may be initially N-type silicon, the N-type conductivity being due to the incorporation of a donor impurity such as arsenic therein. A P–N junction in this body is formed by diffusing an acceptor impurity therein. A suitable acceptor impurity may be boron, for example. To obtain the diffusion of boron, the diffusant source 20 may comprise $B_2O_3$ in powder form which when heated to a temperature of at least 1000° C. forms a vapor containing boron which will readily diffuse into silicon.

In a preferred method for carrying out the diffusion of boron into silicon, the diffusant source 20 of boron is first placed in the diffusion vessel 4 without the silicon body 2 being contained therein. The diffusion vessel 4 is then inserted into the furnace tube 24 in the furnace 26. After purging the diffusion chamber 10 with an inert gas, as described previously, the diffusant source 20 is heated to form a boron-diffusing atmosphere. Depending upon the temperature and the size and shape of the diffusion chamber 10, this boron diffusing atmosphere is maintained for a period of time sufficient to permit the interior of the diffusion chamber to become thoroughly saturated with boron. In a quartz diffusion vessel having a volume of about 1000 cc., this saturation was attained after 30 minutes at a temperature of 1250° C. It has been discovered that the irregularity in the diffusion of boron into silicon during the initial stages of diffusion has occurred in the past because significant amounts of boron were absorbed by the apparatus itself. After saturation of the diffusion chamber with boron, the diffusion vessel 4 is withdrawn from the furnace tube 24 and the silicon wafer 2 is inserted therein. At this point, the diffusant source 20 may be removed if desired, it having also been discovered that the saturated diffusing chamber 10 will serve as a satisfactory source of diffusant if the foregoing saturation technique has been employed. After re-insertion of the diffusing vessel 4 into the furnace tube 24, the system may again be purged with inert gas as described previously and diffusion is accomplished in a similar manner as described.

A donor impurity may be diffused into a semiconductive body by similar technique although there appears to be less tendency of the apparatus to absorb donor impurities. To accomplish the diffusion of a donor impurity into the semiconductive body 2, the diffusant source 20 may include, for example, about five grams of $Sb_2O_4$ which is heated to a temperature of 1000° C. whereby antimony is diffused into the semiconductive body.

What is claimed is:

1. The method of treating a semiconductive body comprising the steps of: establishing an atmosphere containing a conductivity-type-determining impurity in a vessel in which said semiconductive body is to be treated but before disposing said semicondutive body in said vessel, whereby said vessel absorbs said conductivity-type-determining impurity, thereafter disposing said semiconductive body in said vessel, establishing an atmosphere of inert gas around said vessel, and heating said vessel to establish a diffusant atmosphere containing said absorbed conductivity-type-determining impurity within said vessel to thereby diffuse said impurity into said semiconductive body from said diffusant atmosphere.

2. The method of treating a semiconductive body of silicon comprising the steps of: establishing an atmosphere containing an acceptor impurity in a vessel in which said silicon body is to be treated but before disposing said silicon body in said vessel, whereby portions of said vessel become saturated with said acceptor impurity, thereafter disposing said silicon body in said vessel, establishing an atmosphere of inert gas around said vessel, and heating said vessel to establish a diffusant atmosphere containing said acceptor impurity within said vessel to thereby diffuse said acceptor impurity into said silicon body from said diffusant atmosphere.

3. The method according to claim 2 wherein said acceptor impurity is boron.

4. The method of treating a semiconductive body comprising the steps of: flowing a first atmosphere which includes substantially only an inert gas at a first velocity around and through a vessel containing a semiconductive body, flowing said first amosphere at a reduced velocity around said vessel, and establishing a second atmosphere containing a conductivity-type-determining impurity in said vessel and diffusing said conductivity-type-determining impurity into said semiconductive body from said second atmosphere while maintaining said first atmosphere flowing at said reduced velocity around and in contact with said vessel and diffusing said impurity from said second atmosphere into said semiconductive body.

5. The method of treating a semiconductive body comprising the steps of: flowing a first atmosphere which includes substantially only an inert gas at a first velocity around and through a vessel containing a semiconductive body and a conductivity-type-determining impurity, flowing said first atmosphere at a reduced velocity around said vessel, and establishing a second atmosphere containing said conductivity-type-determining impurity in said vessel and diffusing said conductivity-type-determining impurity into said semiconductive body from said second atmosphere while maintaining said first atmosphere at said reduced velocity around and in contact with said vessel.

6. The method according to claim 5 wherein said second atmosphere is established by heating said conductivity-type-determining impurity in said vessel.

References Cited by the Examiner

UNITED STATES PATENTS 3,066,052 11/62 Howard ---------------- 148—189

BENJAMIN HENKIN, *Primary Examiner.*